(12) United States Patent
Stephelbauer et al.

(10) Patent No.: US 7,282,995 B2
(45) Date of Patent: Oct. 16, 2007

(54) VARIABLE GAIN AMPLIFIER

(75) Inventors: Carl Stephelbauer, Ennsdorf (AT); Markus Zannoth, München (DE)

(73) Assignee: Infineon Technologies, AG, Neubiberg (DE)

( * ) Notice: Subject to any disclaimer, the term of this patent is extended or adjusted under 35 U.S.C. 154(b) by 97 days.

(21) Appl. No.: 11/047,492

(22) Filed: Jan. 31, 2005

(65) Prior Publication Data

US 2006/0170495 A1 Aug. 3, 2006

(51) Int. Cl.
  *H03F 3/45* (2006.01)
(52) U.S. Cl. ........................ 330/254; 330/311
(58) Field of Classification Search ............. 455/127.2, 455/127.3
  See application file for complete search history.

(56) References Cited

U.S. PATENT DOCUMENTS

| 6,930,549 | B2 * | 8/2005 | Kajiwara et al. ........... 330/254 |
| 2004/0092236 | A1 * | 5/2004 | Irie et al. ..................... 455/118 |
| 2004/0137862 | A1 * | 7/2004 | Tanaka et al. ........... 455/127.3 |

* cited by examiner

*Primary Examiner*—Robert Pascal
*Assistant Examiner*—Alan Wong
(74) *Attorney, Agent, or Firm*—Edell, Shapiro & Finnan, LLC

(57) ABSTRACT

A high frequency amplifier arrangement comprises a first stage with a modulator receiving a baseband signal, and a controllable current shunting device coupled with the modulator; a second stage coupled with the first stage comprising a gain controllable emitter follower; a third stage comprising a gain controllable amplifier coupled with the second stage; and a gain control unit for providing control signals for the first, second and third stage.

25 Claims, 2 Drawing Sheets

VARIABLE GAIN AMPLIFIER

FIELD OF THE INVENTION

The present invention relates to a variable gain amplifier arrangement including a modulator in particular for use in the field of mobile phones.

BACKGROUND OF THE INVENTION

A radio-frequency signal to be transmitted is normally amplified in the front end of a mobile radio before it is emitted via an antenna. The transmission is normally at a variable radio-frequency output power. This is matched, inter alia, to external characteristics such as the distance to a base station at that time.

In modern third-generation mobile radios which operate on the basis of the UMTS (Universal Mobile Telecommunications Standard) mobile radio standard, the radio-frequency output power has to be variable over a very wide range. For example, a specification might require a "worst case" gain range of 83 dB. To achieve such rates so-called VGA, Variable Gain Amplifier, are typically provided in the transmission path of a corresponding communication appliance. An external control voltage is normally used to control the gain of this amplifier, with a signal to be transmitted being amplified as a function of this control voltage. Curve 1 in FIG. 3 shows a typical probability distribution of different output power requirements.

Furthermore, whenever the gain of the amplifier is changed, there is a need for maintaining carrier signal suppression. Also, the mean power consumption over a predefined statistical output power probability should be minimal. Thus, a maximum standby and usage time for mobile phones can be obtained.

SUMMARY OF THE INVENTION

A high frequency amplifier arrangement comprises a first stage with a modulator receiving a baseband signal, and a controllable current shunting device coupled with the modulator; a second stage coupled with the first stage comprising a gain controllable emitter follower; a third stage comprising a gain controllable amplifier coupled with the second stage; and a gain control unit for providing control signals for the first, second and third stage.

The first, second, and third stage may receive and generate differential signals. The modulator may comprise a high frequency oscillator circuit and the current shunting device may comprise a first and second bipolar transistor wherein the collector emitter path of the first transistor is coupled between the high frequency oscillator and the modulator and the collector emitter path of the second transistor is coupled between the modulator and a supply voltage. The current shunting device may comprise two sets of first and second bipolar transistors for each differential signal. An output signal of the first stage can be decoupled from the collector of the first transistor. The second stage may comprise a third bipolar transistor whose collector emitter path is coupled between a supply voltage and a first controllable current source. The base of the third transistor may receive the output signal of the first stage. The emitter follower may comprise two sets of the third bipolar transistor and first controllable current source for each differential signal. A differential output signal of the second stage can be received from the emitter of the third transistor of each set. The third stage may comprises a differential amplifier receiving the differential output signal of the second stage.

A high frequency amplifier arrangement may also comprise a first stage with means for modulating a high frequency signal by a baseband signal; means for providing a high frequency signal; controllable means for current shunting coupled between the means for modulating and the means for providing a high frequency signal; a second stage coupled with the first stage comprising a gain controllable emitter follower means; a third stage comprising means for amplifying with a controllable gain coupled with the second stage; and means for providing control signals for the first, second and third stage.

The first, second, and third stage may receive and generate differential signals.

Another embodiment of a high frequency amplifier arrangement may comprise a first stage comprising a modulator receiving a baseband signal comprising means for modulating and a high frequency oscillator circuit, and a controllable current shunting device coupled with the modulator, comprising a first and second bipolar transistor wherein the collector emitter path of the first transistor is coupled between the high frequency oscillator and the means for modulating and the collector emitter path of the second transistor is coupled between the means for modulating and a supply voltage; a second stage coupled with the first stage comprising a gain controllable emitter follower; a third stage comprising a gain controllable amplifier coupled with the second stage; and a gain control unit for providing control signals for the first, second and third stage.

The first, second, and third stage may receive and generate differential signals and the current shunting device may comprise two sets of first and second bipolar transistors for each differential signal. An output signal of the first stage can be decoupled from the collector of the first transistor. The second stage may comprise a third bipolar transistor whose collector emitter path is coupled between a supply voltage and a first controllable current source and the base of the third transistor receives the output signal of the first stage. The emitter follower may comprise two sets of the third bipolar transistor and first controllable current source for each differential signal. A differential output signal of the second stage can be received from the emitter of the third transistor of each set. The third stage may comprise a differential amplifier receiving the differential output signal of the second stage.

A method for modulating and amplifying a baseband signal may comprise the steps of providing an adjustable constant current by a current shunting device for a modulator; modulating a high frequency signal with the baseband signal using the adjustable constant current; amplifying the modulated high frequency signal by an emitter follower with a variable gain; further amplifying the amplified signal by a final amplifier stage with a variable gain; and providing control signals for the current shunting device, the emitter follower, and the final amplifier stage.

The step of modulating the high frequency signal may comprise the steps of providing a high frequency signal; and modulating the high frequency signal with the baseband signal by coupling the high frequency signal through the current shunting device thereby providing the adjustable constant current for modulation. The baseband signal can be a differential signal. The method may further comprise the step of decoupling the modulated high frequency signal from the emitter follower. A variable gain can be achieved by changing the adjustable constant current, the variable gain of the emitter follower, and the variable gain of the final amplifier stage concurrently. A variable gain can also be achieved by first changing the variable gain of the final amplifier stage concurrently, then, changing the variable gain of the emitter follower, and then, changing the adjustable constant current.

Other technical advantages of the present disclosure will be readily apparent to one skilled in the art from the following figures, descriptions, and claims. Various embodiments of the present application obtain only a subset of the advantages set forth. No one advantage is critical to the embodiments.

DETAILED DESCRIPTION OF THE PREFERRED EMBODIMENTS

Figure 1:
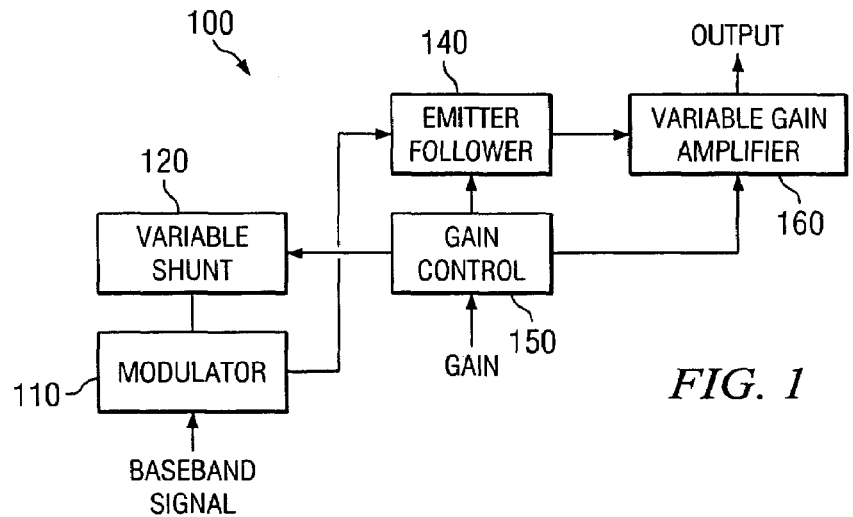
FIG. 1 shows a block diagram of an exemplary embodiment of a variable gain amplifier arrangement including a modulator.

FIG. 1 shows a block diagram of an exemplary embodiment of a variable gain amplifier arrangement 100. A baseband signal is provided and supplied to a high frequency modulator 110. The high frequency modulator operates with a "constant" current. However, the current is provided by a variable shunt 120 which is controlled by gain control unit 150. Thus, the variable shunt provides different "constant" currents depending on the gain signal provided to the gain control unit. The variable shunt 120 is, thus, suitably coupled with the modulator 110. Thus, these two units 110, and 120 comprise one stage of the variable gain amplification arrangement. Depending on the needed output power, the gain control unit provides the variable shunt 120 with a respective control signal to regulate the "constant" current provided for the modulator 110.

The output signal of this first stage is fed to an emitter follower 140 which is also controlled in its amplification by gain control unit 150. This second stage, thus, also provides a variable gain even though more limited than the first stage.

The output signal of this second stage 140 is then fed to output power amplifier 160. Again, the gain of this final stage is also controlled by the gain control unit 150. The gain control unit 150 receives the signal "gain" according to which the different stages of the amplifier arrangement are controlled in their respective gain. The power amplifier stage 160 then provides for the output signal.

By means of such a specific arrangement, a high final gain can be obtained whereby disadvantages of certain aspects of such an arrangement are avoided. Usually, a current shunting stage has the disadvantage of a constant power consumption, namely the constant current. Thus, such a current shunting stage generally does not save power when the output power is decreased. However, in case of a low power consumption such a shunting stage generally allows for an easy maintenance of the linearity requirements and, thus, the current can be easily reduced. Nevertheless, the modulator 110 in this arrangement is designed in such a way that it needs a constant current. Thus, combining a controllable current shunting stage 120 with the modulator 110 avoids the usual disadvantage of such a stage as the modulator 110 requires a constant current anyway. As can be seen in FIG. 1, the design allows for very short signal paths between the three stages. However, a very high gain can still be obtained. Because of the use of a constant current for the modulator 110, the operating points of the modulator 110 will remain constant. Furthermore, the high frequency parameters, namely, the single sideband suppression and the carrier suppression of the modulator are, thus, more or less independent from the gain control voltage changes and the output power, respectively. Furthermore, only a single current shunting stage is necessary. As mentioned above, by implementing this shunting stage 120 in connection with the modulator 110, the general disadvantage of such a stage is avoided because the modulator 110 requires a constant current supply anyway. Such a current shunting stage can reach, for example, a gain range of around 52 dB depending on the layout.

The currents in the emitter follower 140 and the power amplifier 160 may then be heavily reduced in case of power consumption reduction. The operating point of the emitter follower 140 will be controlled concurrent with the following power amplifier stage 160 which forms the load for the emitter follower 140. Thus, the emitter follower 140 is able to reach a gain range of about 12 dB. This gain variation can be obtained by selectively changing the output impedance of the output of the emitter follower 140. Finally, the power amplifier stage 160 allows for a gain range of about 28 dB. Thus, a resulting gain range of:

52 dB (current shunting)+12 dB (emitter follower)+ 28 dB (power amplifier)=92 dB can be obtained.

Figure 2:
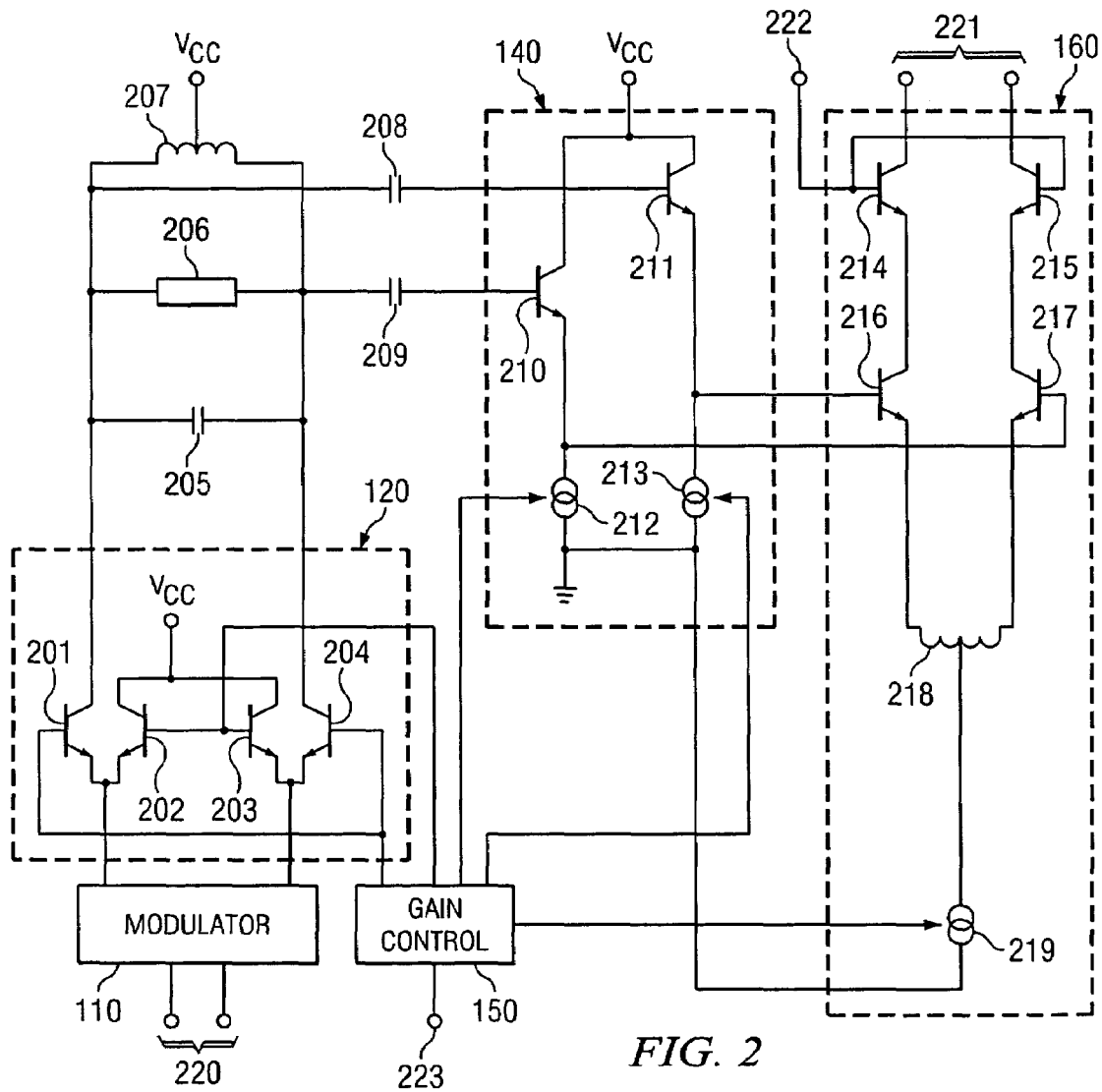
FIG. 2 shows a circuit diagram of another exemplary embodiment of a variable gain amplifier arrangement including a modulator.

FIG. 2 shows a circuit diagram of an exemplary embodiment according to general principle as shown in FIG. 1. Inductor 207 tapped and coupled with the supply voltage Vcc, resistor 206 and capacitor 205 form a parallel resonant circuit. This resonant circuit, which is usually part of the modulator 110, is coupled through a current shunting circuit 120 with modulator 110. Modulator 110 can be any suitable modulator for providing a respective modulation of the high frequency signal with a low frequency signal provided at terminals 220. In this embodiment differential input and output signals are provided. However, other embodiments with non-differential signals are also possible. The current shunting circuit 120 comprises two sets of bipolar transistors, each set coupled with one of the differential output signals of the modulator 110. To this end, the emitters of transistors 201 and 202 are coupled with the first output of modulator 110 and the emitters of transistors 203 and 204 are coupled with the second output of modulator 110. The collectors of transistors 202 and 203 are connected to the supply voltage Vcc. The collectors of transistors 201 and 204 are coupled with the parallel resonant circuit 205, 206, 207. The base terminals of transistors 201 and 204 receive a first gain control signal and the base terminals of transistors 202 and 203 receive a second gain control signal. Both gain control signals are provided by the gain control unit 150. Transistors 202 and 203, therefore, form a controllable current source providing modulator 110 with a constant current. In addition, transistors 201 and 204 provide for the coupling of the parallel resonant circuit 205, 206, 207 with modulator 110. Thus, modulator 110, current shunting circuit 120 and the resonant circuit 205, 206, 207 form the first stage of the amplifying arrangement. The output signal of this first stage can be obtained from the parallel resonant circuit 205, 206, 207.

This output signal is fed to the second stage via decoupling capacitors 208 and 209. The second stage is formed by an emitter follower 140 comprising two bipolar transistors 210 and 211. The output signal of the first stage is fed to the base terminals of these transistors 210 and 211. The collectors of transistors 210 and 211 are coupled with the supply voltage Vcc. The emitter terminals are coupled via respective controllable current sources 212 and 213 with ground. The controllable current sources are controlled by third and fourth gain control signals, respectively. These control signals are generated by the gain control unit 150. The output signals of this emitter follower can be obtained from the emitters of transistors 210 and 211.

The third stage is formed by a typical differential amplifier with cascode configuration 160. Each branch of the differential amplifier comprises, for example, two bipolar transistors 214, 216 and 215, 217, respectively. The load paths of transistors 214 and 216 and of transistors 215 and 217 are each coupled in series, respectively. The emitter terminals of transistors 216 and 217 are coupled through inductor 218 which is provided with a tap coupled with ground through a controllable current source 219. The base terminals of transistors 216 and 217 receive the output signals of the second stage 140. The base terminals of transistors 214 and 215 are coupled to receive a bias voltage from terminal 222. The amplified high frequency output signal can be obtained from terminals 221 coupled with the collector terminals of transistors 214 and 215, respectively. The controllable current source 219 is controlled by a fifth gain control signal generated by gain control unit 150.

Figure 4:
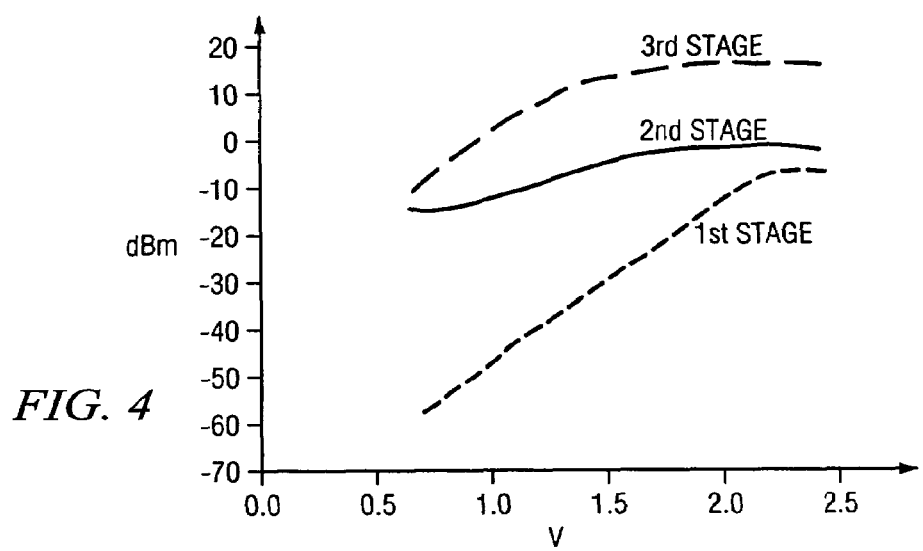
FIG. 4 depicts a diagram showing the gain distribution of different stages of a variable gain amplifier arrangement including a modulator.

Gain control unit 150 generates all necessary gain control signals from a gain input signal received from terminal 223. This gain input signal indicates what gain has to be realized by the three stage amplifier. Gain control unit 150 then generates the necessary gain control signals for each stage. FIG. 4 shows a respective possible distribution of the different gains of each stage over the gain input signal. The currents of the emitter follower provided by the controllable current sources 212 and 213 and the currents of the output buffer provided by controllable current source 219, as well as the control voltage for the current shunting 120 are usually increased/decreased in the same dimension all together. Thus, in a preferred embodiment, no stage has to get a current change whereas any other stage stays constant. As a result, no hard transitions exist in the dependencies of control signal and gain, because all stages change their gain (due to the current change) in the same way. However, in another embodiment, it is also possible to change first the gain of the last stage 160, then at the emitter follower 140 and then of the current shunting 120. However, this might result in a suboptimal power consumption. Therefore, in the preferred embodiment all the current changes of all stages are performed concurrently.

Figure 3:
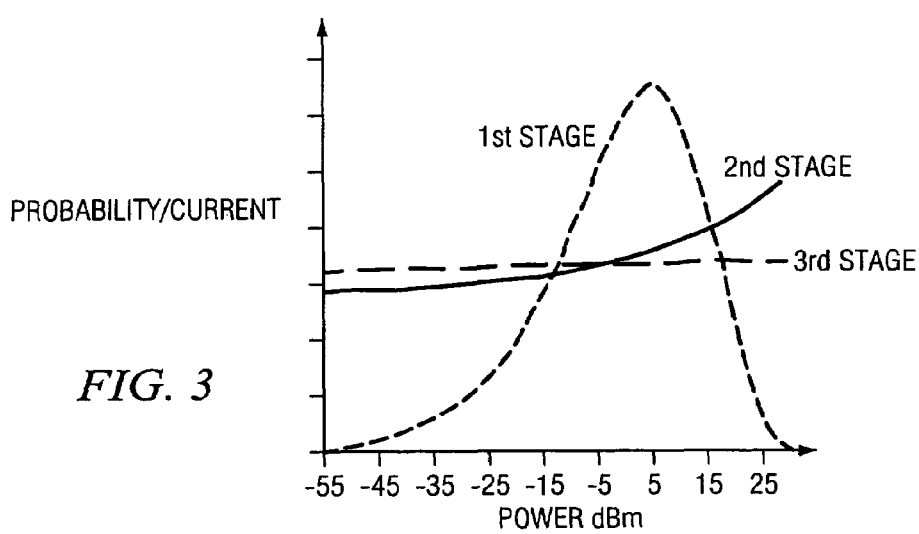
FIG. 3 depicts a diagram showing power consumption and probability of power consumption.
Figure 5:
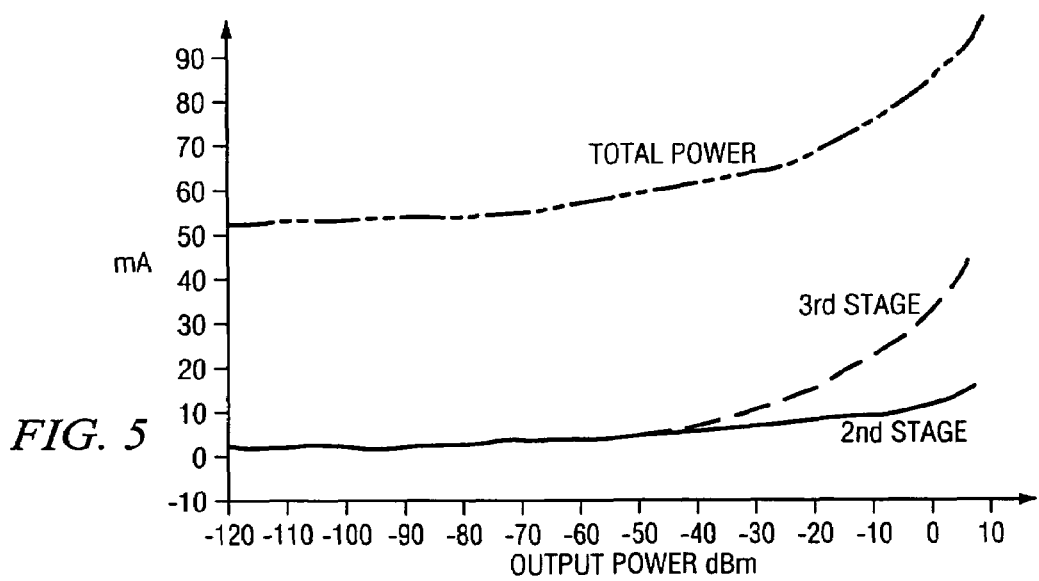
FIG. 5 depicts a diagram showing the power consumption.

The resulting power consumption can be seen in FIG. 5. The power consumption of only two stages, namely the second and third stage is shown here because most of the other circuits provide for a more or less constant power consumption. The top curve illustrates the overall power consumption of the amplifier arrangement. This power consumption curve of FIG. 5 is also shown in FIG. 3 with curve 2. In addition, FIG. 3 shows the average current consumption with curve 3. This minimized average current consumption will lead to an increased standby and usage time of a portable battery operated device.

We claim:

1. A high frequency amplifier arrangement comprising:
    a first stage comprising:
        a modulator receiving a baseband signal;
        a controllable current shunting device providing a current to said modulator;
    a second stage coupled with said first stage comprising a gain controllable emitter follower;
    a third stage comprising a gain controllable amplifier coupled with said second stage; and
    a gain control unit for providing control signals for said first, second and third stage.

2. The amplifier arrangement according to claim 1, wherein said first, second, and third stage receive and generate differential signals.

3. The amplifier arrangement according to claim 1, wherein said modulator comprises a high frequency oscillator circuit and wherein said current shunting device comprises a first and second bipolar transistor wherein the collector emitter path of the first transistor is coupled between said high frequency oscillator and said modulator and the collector emitter path of said second transistor is coupled between said modulator and a supply voltage.

4. The amplifier arrangement according to claim 3, wherein said first, second, and third stage receive and generate differential signals and said current shunting device comprises two sets of first and second bipolar transistors for each differential signal.

5. The amplifier arrangement according to claim 3, wherein an output signal of said first stage is decoupled from the collector of said first transistor.

6. The amplifier arrangement according to claim 1, wherein the second stage comprises a third bipolar transistor whose collector emitter path is coupled between a supply voltage and a first controllable current source.

7. The amplifier arrangement according to claim 5, wherein the second stage comprises a third bipolar transistor whose collector emitter path is coupled between a supply voltage and a first controllable current source and the base of said third transistor receives said output signal of said first stage.

8. The amplifier arrangement according to claim 6, wherein said first, second, and third stage receive and generate differential signals and said emitter follower comprises two sets of said third bipolar transistor and first controllable current source for each differential signal.

9. The amplifier arrangement according to claim 8, wherein a differential output signal of said second stage is received from the emitter of said third transistor of each set.

10. The amplifier arrangement according to claim 9, wherein said third stage comprises a differential amplifier receiving said differential output signal of said second stage.

11. A high frequency amplifier arrangement comprising:
    a first stage comprising:
        means for modulating a high frequency signal by a baseband signal;
        means for providing the high frequency signal; and
        controllable means for current shunting coupled between said means for modulating and said means for providing a high frequency signal;
    a second stage coupled with said first stage comprising a gain controllable emitter follower means;
    a third stage comprising means for amplifying with a controllable gain coupled with said second stage; and
    means for providing control signals for said first, second and third stage.

12. The amplifier arrangement according to claim 1, wherein said first, second, and third stage receive and generate differential signals.

13. A method for modulating and amplifying a baseband signal comprising the steps of:
providing an adjustable constant current by a current shunting device for a modulator;
modulating a high frequency signal with said baseband signal using said adjustable constant current;
amplifying said modulated high frequency signal by an emitter follower with a variable gain;
further amplifying said amplified signal by a final amplifier stage with a variable gain; and
providing control signals for said current shunting device, said emitter follower, and said final amplifier stage.

14. The method according to claim 13, wherein the step of modulating the high frequency signal comprises the steps of:
providing the high frequency signal;
modulating said high frequency signal with said baseband signal by coupling said high frequency signal through said current shunting device thereby providing said adjustable constant current for modulation.

15. The method according to claim 13, wherein said baseband signal is a differential signal.

16. The method according to claim 13, further comprising the step of decoupling said modulated high frequency signal from said emitter follower.

17. The method according to claim 13, wherein a variable gain is achieved by changing the adjustable constant current, the variable gain of the emitter follower, and the variable gain of the final amplifier stage concurrently.

18. The method according to claim 13, wherein a variable gain is achieved by:
first changing the variable gain of the final amplifier stage concurrently,
then, changing the variable gain of the emitter follower, and
then, changing the adjustable constant current.

19. A high frequency amplifier arrangement comprising:
a first stage comprising:
a modulator receiving a baseband signal comprising means for modulating and a high frequency oscillator circuit,
a controllable current shunting device coupled with said modulator, comprising a first and second bipolar transistor wherein the collector emitter path of the first transistor is coupled between said high frequency oscillator and said means for modulating and the collector emitter path of said second transistor is coupled between said means for modulating and a supply voltage;
a second stage coupled with said first stage comprising a gain controllable emitter follower;
a third stage comprising a gain controllable amplifier coupled with said second stage; and
a gain control unit for providing control signals for said first, second and third stage.

20. The amplifier arrangement according to claim 19, wherein said first, second, and third stage receive and generate differential signals and said current shunting device comprises two sets of first and second bipolar transistors for each differential signal.

21. The amplifier arrangement according to claim 19, wherein an output signal of said first stage is decoupled from the collector of said first transistor.

22. The amplifier arrangement according to claim 21, wherein the second stage comprises a third bipolar transistor whose collector emitter path is coupled between a supply voltage and a first controllable current source and the base of said third transistor receives said output signal of said first stage.

23. The amplifier arrangement according to claim 22, wherein said first, second, and third stage receive and generate differential signals and said emitter follower comprises two sets of said third bipolar transistor and first controllable current source for each differential signal.

24. The amplifier arrangement according to claim 23, wherein a differential output signal of said second stage is received from the emitter of said third transistor of each set.

25. The amplifier arrangement according to claim 24, wherein said third stage comprises a differential amplifier receiving said differential output signal of said second stage.

* * * * *